United States Patent
Osanai

(10) Patent No.: US 6,881,617 B2
(45) Date of Patent: Apr. 19, 2005

(54) MANUFACTURING METHOD FOR BIPOLAR GATE CMOS SEMICONDUCTOR DEVICE

(75) Inventor: Jun Osanai, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 10/647,945

(22) Filed: Aug. 26, 2003

(65) Prior Publication Data

US 2004/0166615 A1 Aug. 26, 2004

(30) Foreign Application Priority Data

Aug. 28, 2002 (JP) ........................................ 2002-248540

(51) Int. Cl.⁷ .......................................... H01L 21/8238
(52) U.S. Cl. ........................ 438/199; 438/229; 438/232
(58) Field of Search ................................ 438/197, 199, 438/229, 232, 299, 301, 306

(56) References Cited

U.S. PATENT DOCUMENTS

| | | | | |
|---|---|---|---|---|
| 4,045,259 A | * | 8/1977 | Sanders | ...................... 438/232 |
| 5,563,093 A | * | 10/1996 | Koda et al. | .................. 438/231 |
| 6,258,646 B1 | * | 7/2001 | Fulford et al. | .............. 438/231 |

* cited by examiner

Primary Examiner—Robert Pascal
Assistant Examiner—Scott B. Geyer
(74) Attorney, Agent, or Firm—Adams & Wilks

(57) ABSTRACT

A manufacturing method for a bipolar gate CMOS semiconductor device is provided that eliminates a masking process for P-type polycrystalline silicon. An N-type polycrystalline silicon region is selectively formed in polycrystalline silicon constituting a gate electrode through predeposition using an insulating film as a mask, after which the insulating film is removed to implant P-type impurity ions into the entire surface to form a P-type polycrystalline silicon region.

6 Claims, 4 Drawing Sheets

MANUFACTURING METHOD FOR BIPOLAR GATE CMOS SEMICONDUCTOR DEVICE

BACKGROUND OF THE INVENTION

The present invention relates to a manufacturing method for a CMOS semiconductor device having a bipolar gate structure, which enables a low-voltage operation and low power consumption.

To enable the low-voltage operation of the semiconductor device, it is necessary to form both of an NMOS and a PHOS constituting the CMOS as surface-channel type elements. Here, for explaining a manufacturing method for a conventional bipolar gate CMOS semiconductor device, with which the above structure is achieved, a half-completed structure in its production is shown in FIG. 8. An N-well region 202 is partially formed with a boundary defined by a field insulation film 203 formed on a P-type semiconductor substrate 201. A gate insulating film 204 is formed on the P-type semiconductor substrate 201 and the N-well region 202. Then, a polycrystalline silicon film 205 is formed on top thereof. A P-type polycrystalline silicon film region 207 is formed by implanting boron ions using as a mask a resist patterned so as to open a region serving as the PMOS, onto the polycrystalline silicon. Subsequently, an N-type polycrystalline silicon film region 206 is formed by implanting phosphorous ions using as a mask a resist patterned so as to open a region serving as the NMOS (see, for example, Patent Document 1). Also, there is known a forming method capable of achieving the structure of FIG. 8, in which the boron ions are previously implanted into the entire polycrystalline silicon to form the P-type polycrystalline silicon region, after which the phosphorous ions are implanted using as the mask the resist patterned so as to open the region serving as the NMOS, and the N-type polycrystalline silicon region 206 is formed through counter-doping of the phosphorous into the P-type polycrystalline silicon region (see, for example, Patent Document 1).

Patent Document 1

JP 6-310666 A (p.6, FIG. 3(A))

Of the above conventional manufacturing methods, the manufacturing method for the P-type polycrystalline silicon film region and the N-type polycrystalline silicon film region using different masks involves a problem in that a production cost increases in terms of the number of steps. On the other hand, as for the manufacturing method in which the entire polycrystalline silicon is previously changed into the P-type polycrystalline silicon region, after which the P-type polycrystalline silicon region is changed into the N-type polycrystalline silicon region by counter-doping, this method is advantageous in terms of the number of steps but involves such problems that a resistance of a gate electrode cannot be lowered and that element characteristics are largely degraded, e.g., depletion of the gate electrode develops, due to a slight variation of the respective impurities in the steps.

An object of the present invention is to provide a manufacturing method, which enables reduction in the number of masking steps, cost reduction and also, stable element characteristics.

SUMMARY OF THE INVENTION

The present invention adopts the following measures for solving the above-mentioned problem.

(1) A manufacturing method for a semiconductor device is characterized by including: a step of forming an element isolation region and a gate insulating film on a semiconductor substrate; a step of forming a polycrystalline silicon film for subsequently forming a gate electrode on the element isolation region and the gate insulating film; a step of forming an insulating film on the polycrystalline silicon film; a step of patterning the insulating film so as to open a region other than a region subsequently serving as a PMOS; a step of changing the regions of the polycrystalline silicon film corresponding to an insulating film opening into an N-type region by heat treatment in a diffusion furnace in an N-type impurity atmosphere; a step of removing the insulating film patterned; and a step of doping a P-type impurity into an entire surface of the polycrystalline silicon film through an ion implantation.

(2) A manufacturing method for a semiconductor device is characterized by further including forming a high melting point metal silicide including a tungsten silicide, a molybdenum silicide, or a titanium silicide, on the polycrystalline silicon.

(3) A manufacturing method for a semiconductor device is characterized in that the polycrystalline silicon film has a thickness of 50 nm to 400 nm.

(4) A manufacturing method for a semiconductor device is characterized in that the insulating film has a thickness of 100 nm or more.

(5) A manufacturing method for a semiconductor device is characterized in that the N-type polycrystalline silicon has an impurity concentration of $1 \times 10^{20}/cm^3$ or more.

(6) A manufacturing method for a semiconductor device is characterized in that a dosage of a P-type impurity ion in the ion implantation is $1 \times 10^{15}/cm^2$ or more.

DETAILED DESCRIPTION

Hereinafter, an embodiment of a manufacturing method for a semiconductor device according to the present invention will be described with reference to the accompanying drawings.

Figure 1:
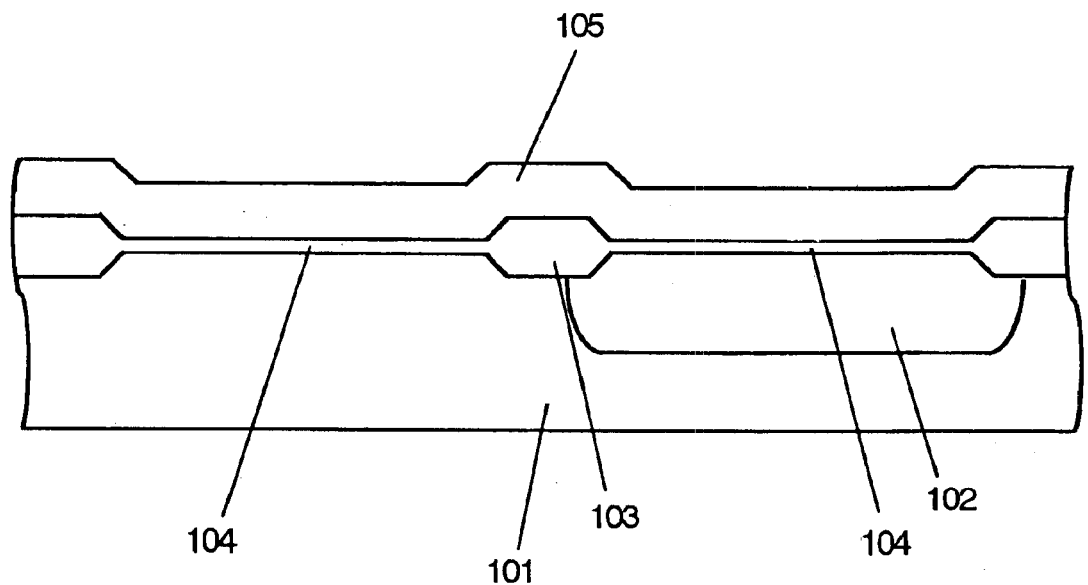
FIG. 1 is a schematic sectional view showing a manufacturing method for a semiconductor device according to an embodiment of the present invention.

FIG. 1 shows how an N-well 102 is formed on a P-type semiconductor substrate 101 according to a conventional method and then, a field insulation film 103 is formed as an element isolation region by so-called LOCOS, after which a gate insulating film 104 is formed through thermal oxidation in an electric furnace, for instance, followed by coating the top with a polycrystalline silicon 105.

In this example, an N-well structure using the P-type semiconductor substrate is adopted. However, also in a P-well type structure using an N-type semiconductor substrate, effects of the present invention can be obtained in the same way. Also, in the figure, a single well structure is shown, but the effects of the present invention can be similarly exerted by adopting a twin well structure where the P-well and the N-well are both formed.

Further, although not shown in the figure, in some cases, an impurity is doped into a channel portion through ion implantation for controlling a threshold voltage of the MOS before or after the formation of the gate insulating film 104. At this time, if the threshold voltage is of an enhancement mode, an acceptor impurity, for example, boron is doped in a region serving as an NMOS, whereas a donor impurity, for example, arsenic is doped in a region serving as a PMOS, similarly if the threshold voltage is of an enhancement mode.

The polycrystalline silicon film is formed on an oxide film by decomposing a silane gas using Chemical Vapor Deposition (hereinafter referred to as CVD) generally at a reduced pressure. A film thickness thereof is, although depending on a gate electrode structure, 300 nm to 400 nm in a case where a polycrystalline silicon single layer is used for the gate electrode, and 50 nm to 250 nm in a case where the gate electrode is of a so-called polycide gate structure where a high melting point metal silicide is deposited on the polycrystalline silicon.

Figure 2:
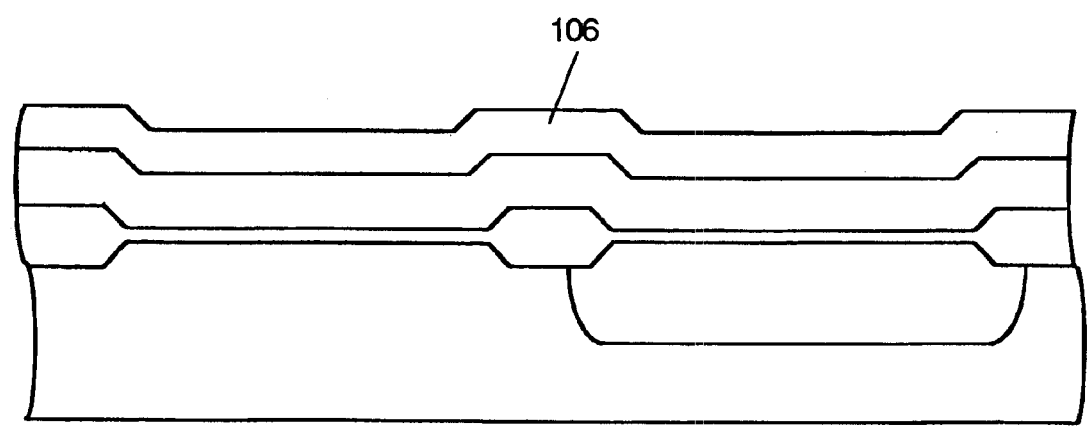
FIG. 2 is a schematic sectional view showing a manufacturing method for a semiconductor device according to an embodiment of the present invention.

Next, as shown in FIG. 2, an insulating film 106 formed of NSG (Nondoped Silicate Glass), for example, is formed on the polycrystalline silicon with a thickness of 100 nm or more by CVD. The film thickness should be equal to or larger than that at the time when the film serves as the mask in the step of doping the N-type impurity into the polycrystalline silicon through predeposition as will be mentioned below. However, in the case of the thick film, it takes a long time to perform high-precision processing or etching. Accordingly, the film thickness of about 200 nm is generally adopted.

When this CVD step is performed at a low temperature of about 400° C., the insulating film should be changed to be dense in view of a mask property. An annealing step is performed at about 900° C. for about 30 minutes subsequently to the insulating film formation. In the case of HTO (High Temp Oxide) that is formed into a film at a relatively high temperature, such an annealing step is unnecessary.

Also, regarding a film material in this step, a silicon oxide film is effective in terms of the mask property and workability. However, any material is applicable as long as the material has a large selection ratio to the base polycrystalline silicon upon processing the insulating film and has the mask property in the predeposition step described later.

Figure 3:
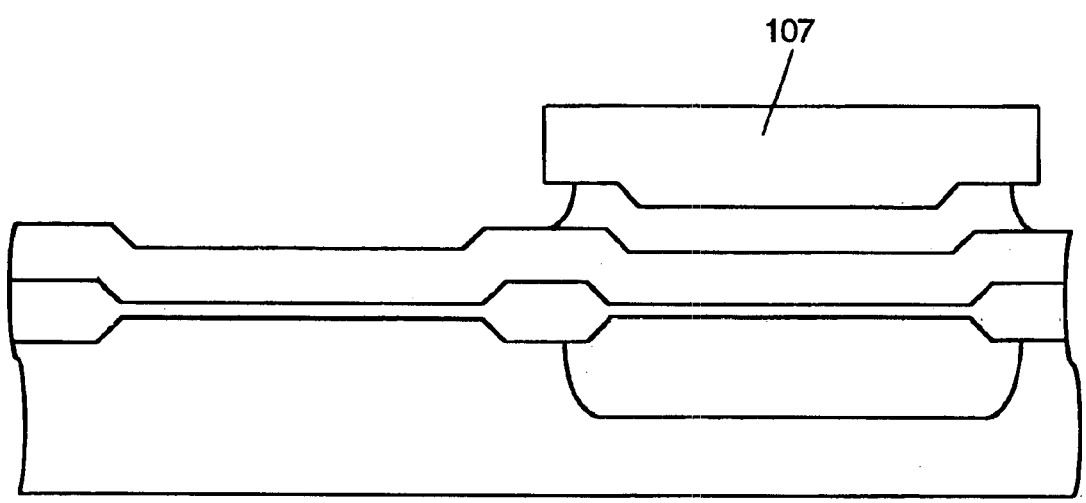
FIG. 3 is a schematic sectional view showing a manufacturing method for a semiconductor device according to an embodiment of the present invention.
Figure 4:
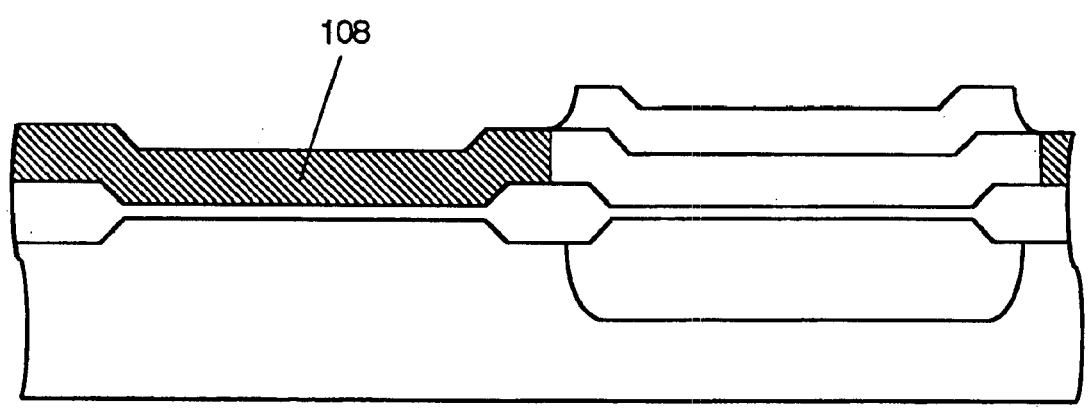
FIG. 4 is a schematic sectional view showing a manufacturing method for a semiconductor device according to an embodiment of the present invention.

Next, a photoresist 107 is so patterned as to open portions other than the region, which later serves as the PMOS through photolithography. Then, the photoresist is used as a mask for etching the insulating film 106 to thereby obtain a structure shown in FIG. 3. In a case where the silicon oxide film is used as the insulating film 106, wet etching using a hydrofluoric acid is generally employed in etching. The wet etching is effective in that the extremely large selection ratio is obtained with respect to the base polycrystalline silicon and a plasma damage is less applied to the element as compared with dry etching. Subsequently, after the photoresist 107 is removed, through the so-called predeposition for doping the impurity by heat treatment in a diffusion furnace in an N-type impurity atmosphere, the polycrystalline silicon except for the region where the insulating film 106 is formed is changed into an N+polycrystalline silicon 108 to thereby obtain a structure shown in FIG. 4. The impurity is only doped into a portion where the polycrystalline silicon is exposed and thus, is not doped into a region covered with the insulating film. As the impurity in this case, phosphorous is used, which is widely employed in the predeposition.

The predeposition only requires an inexpensive apparatus as compared with the ion implantation and is more advantageous than the ion implantation in that the impurities can be readily doped at an extremely high concentration of $1 \times 10^{20}/cm^3$ or higher, that is, in terms of low resistance. Also in this step, the impurities are sufficiently diffused and hence, the problem about the depletion of the gate electrode, which may arise in some cases in a bipolar gate structure, can be solved.

Figure 5:
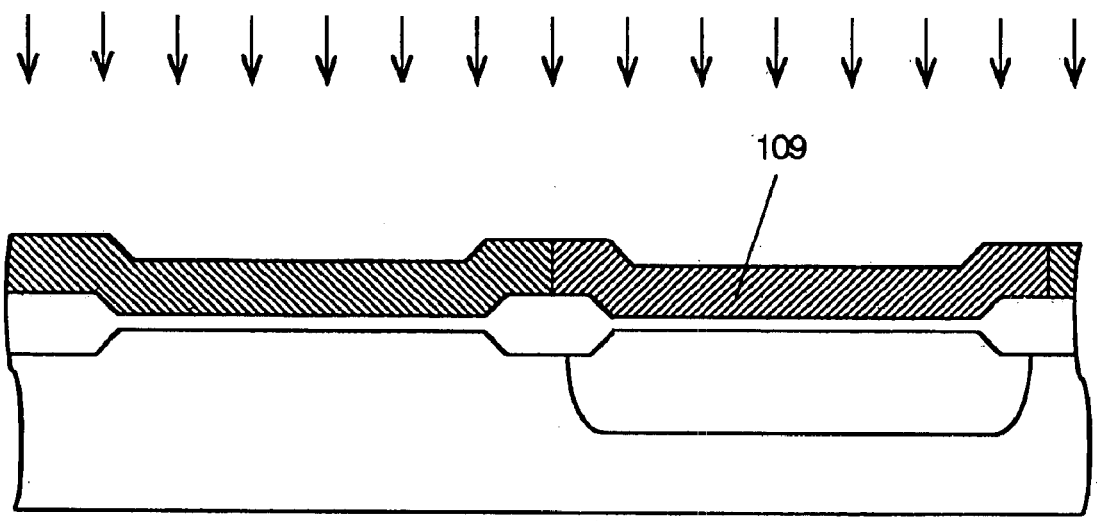
FIG. 5 is a schematic sectional view showing a manufacturing method for a semiconductor device according to an embodiment of the present invention.

Next, as shown in FIG. 5, the insulating film is removed through the wet etching in a hydrofluoric acid solution, after which P-type impurities such as boron and $BF_2$ are doped into the entire polycrystalline silicon surface by the ion implantation, followed by the heat treatment. Thus, the polycrystalline silicon on the region, which later serves as the PMOS is changed into a P+ polycrystalline silicon region 109. At this time, the doping is performed with an impurity dosage of $1 \times 10^{15}/cm^2$ or more. Although depending on heat treatment conditions in the subsequent steps, heat treatment conditions are as follows: 800° C. to 850° C. for about 30 minutes in the case of the heat treatment in the electric furnace, and 900° C. to 1050° C. for about 15 seconds to 1 minute in the case of RTA (Rapid Thermal Annealing).

The polycrystalline silicon region, which is previously doped with the N-type impurity, is doped with the impurity at the extremely high concentration through the predeposition. Therefore, even if the P-type impurity is doped therein with the dosage of about $10^{-15}/cm^2$ through the ion implantation, its conductivity is not inverted and a resistance value can be kept low.

In the case of a P-type gate electrode, when the heat treatment is excessively performed, there arises a problem in that the boron passes therethrough to reach the inside of the channel, thereby causing a variation of a threshold value of the PMOS. In contrast, when the heat treatment is insufficient, there arises a problem in the degraded element characteristics due to the depletion of the gate electrode. In addition, the bipolar gate structure involves such a problem that designing for manufacturing the element is required in consideration of optimization upon the N-type gate electrode formation of the NMOS and production conditions are extremely limited. According to the manufacturing method of the present invention, however, the N-type gate electrode structure of the NMOS has been already obtained in the preceding step. As a result, the production conditions concerning the heat treatment for the P-type gate electrode formation, the dosage, and the like can be set independently of the N-type gate electrode formation. Thus, various problems involved in the bipolar gate structure can be eliminated.

Figure 6:
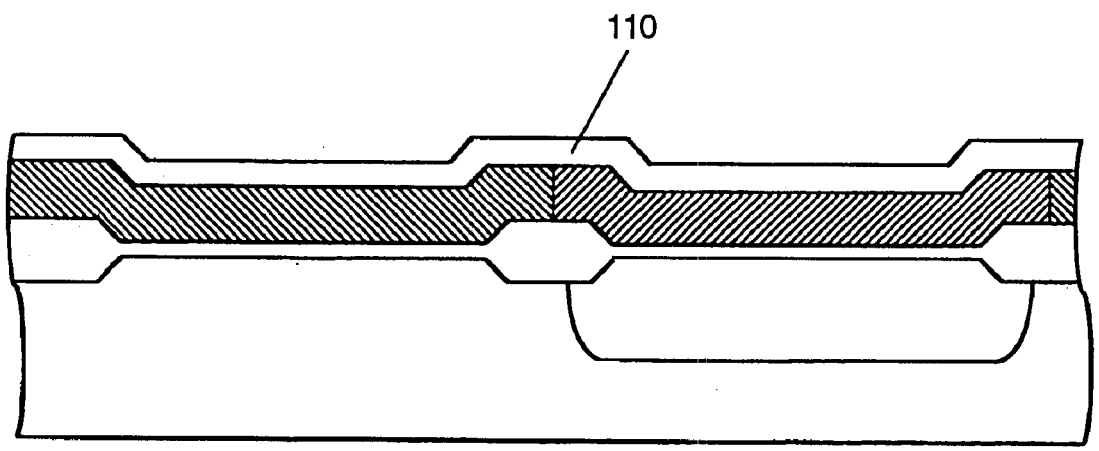
FIG. 6 is a schematic sectional view showing a manufacturing method for a semiconductor device according to an embodiment of the present invention.

Next, as shown in FIG. 6, a high melting point metal silicide 110 is deposited onto the polycrystalline silicon by sputtering. A silicide material includes, for example, tungsten silicide, molybdenum silicide, or titanium silicide, with a film thickness of 100 nm to 250 nm.

This process is performed for the further reduction in resistance of the gate electrode as well as layer formation, with which the P-type polycrystalline silicon and the N-type polycrystalline silicon can be directly bonded even through no metal wiring. This process is unnecessary for a product, which does not suffer any problem that would crop out if this step is not performed. In such a product, the gate electrode may be formed using the polycrystalline silicon single layer.

Figure 7:
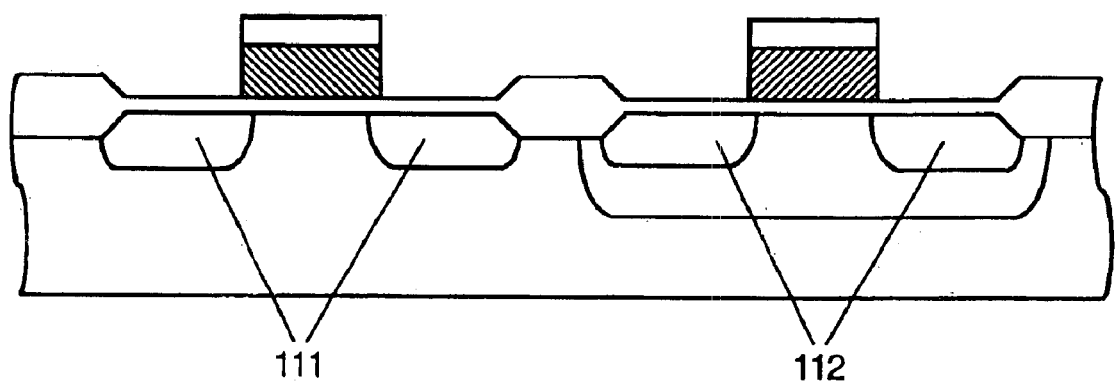
FIG. 7 is a schematic sectional view showing a manufacturing method for a semiconductor device according to an embodiment of the present invention.
Figure 8:
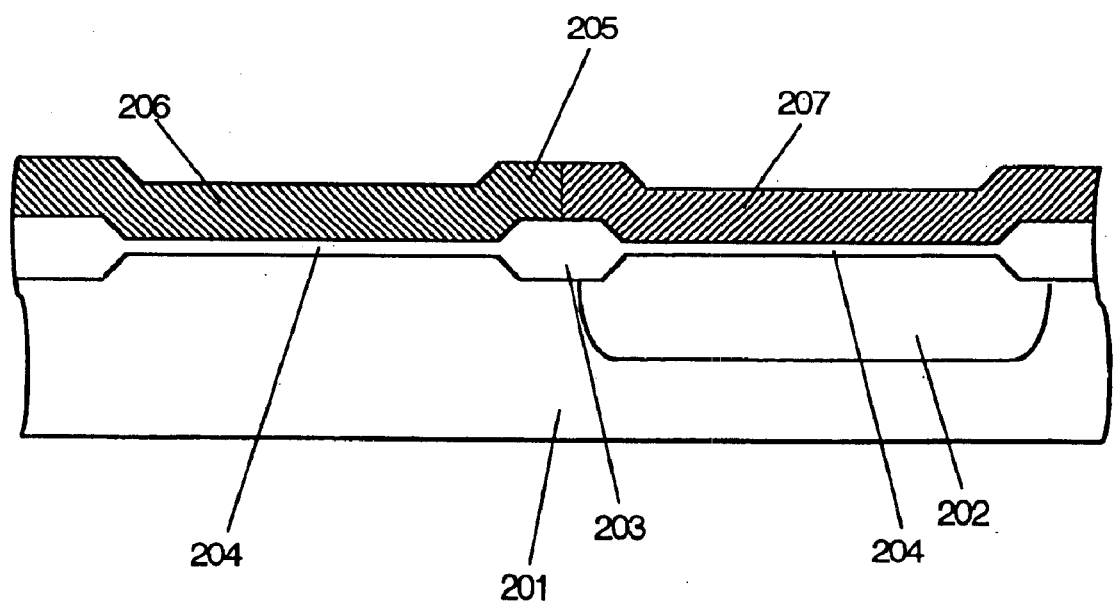
FIG. 8 is a schematic, sectional view showing a manufacturing method for a conventional semiconductor device.

Next, similarly to a general CMOS step, after the gate electrodes of the NMOS and the PMOS are simultaneously formed, N+ diffusion regions 111 serving as source/drain regions of the NMOS and P+ diffusion regions 112 serving as source/drain regions of the PMOS are formed by the ion implantation to obtain a structure of FIG. 7. In this embodiment, a general single drain structure is shown. However, this embodiment is also applicable to a structure with a low concentration drain region, such as a LDD (Lightly Doped Drain) structure, a DDD (Double Diffused Drain) structure, or a mask offset structure having a hot carrier resistance. The same effects are also obtained.

In this embodiment, the manufacturing method is described in which the N-type polycrystalline silicon region is first formed and then, the P-type polycrystalline silicon region is formed. However, it is possible that the entire polycrystalline silicon is first formed to have a P-type conductivity and then, the N-type polycrystalline silicon region is selectively formed through the steps as mentioned in this embodiment. In this case, however, the P-type polycrystalline silicon region excessively undergoes the heat treatment. Thus, such a case is disadvantageous in terms of the variation of the threshold value due to the boron that passes therethrough to reach the channel.

As described above, the present invention provides the manufacturing method for the bipolar gate CMOS semiconductor device, in which the N-type region is selectively formed in the polycrystalline silicon constituting the gate electrode through the predeposition using as the mask the insulating film, after which the insulating film is removed to implant the P-type impurity ions into the entire surface, whereby the semiconductor device can be provided at a low cost with the stable element characteristics.

What is claimed is:

1. A manufacturing method for a semiconductor device characterized by comprising:

a step of forming an element isolation region and a gate insulating film on a semiconductor substrate;

a step of forming a polycrystalline silicon film, for subsequently forming a gate electrode on the element isolation region and the gate insulating film;

a step of forming an insulating film on the polycrystalline silicon film;

a step of patterning the insulating film so as to open a region other than a region subsequently serving as a PMOS;

a step of changing the region of the polycrystalline silicon film corresponding to an insulating film opening into an N-type region by heat treatment in a diffusion furnace in an N-type impurity atmosphere;

a step of removing the insulating film patterned; and a step of doping a P-type impurity into an entire surface of the polycrystalline silicon film through an ion implantation.

2. A manufacturing method for a semiconductor device according to claim 1, further comprising forming a high melting point metal silicide including a tungsten silicide, a molybdenum silicide, or a titanium silicide, on the polycrystalline silicon.

3. A manufacturing method for a semiconductor device according to claim 1, wherein the polycrystalline silicon film has a thickness of 50 nm to 400 nm.

4. A manufacturing method for a semiconductor device according to claim 1, wherein the insulating film has a thickness of 100 nm or more.

5. A manufacturing method for a semiconductor device according to claim 1, wherein the N-type polycrystalline silicon has an impurity concentration of $1 \times 10^{20}/cm^3$ or more.

6. A manufacturing method for a semiconductor device according to claim 1, wherein a dosage of a P-type impurity ion in the ion implantation is $1 \times 10^{15}/cm^2$ or more.

* * * * *